United States Patent [19]

Johnson

[11] Patent Number: 4,700,214
[45] Date of Patent: Oct. 13, 1987

[54] ELECTRICAL CIRCUITRY

[75] Inventor: Morgan Johnson, Woodside, Calif.

[73] Assignee: Laserpath Corporation, Sunnyvale, Calif.

[21] Appl. No.: 53,607

[22] Filed: May 20, 1987

Related U.S. Application Data

[60] Continuation of Ser. No. 847,727, May 12, 1986, abandoned, which is a division of Ser. No. 561,917, Dec. 15, 1983, abandoned.

[51] Int. Cl.$^4$ .............................................. H05K 3/08
[52] U.S. Cl. .................................... 357/68; 174/68.5; 357/45; 357/71; 361/414
[58] Field of Search ........................... 357/68, 71, 45; 361/414; 174/68.5; 29/830, 847

[56] References Cited

U.S. PATENT DOCUMENTS

| | | | |
|---|---|---|---|
| 3,398,326 | 8/1968 | Swart et al. | 174/68.5 X |
| 3,500,346 | 3/1970 | Takeuchi et al. | 340/174 |
| 3,564,115 | 2/1971 | Gribble | 361/414 X |
| 3,605,063 | 9/1971 | Stewart | 361/414 X |
| 3,646,670 | 3/1972 | Maedo et al. | 29/627 |
| 3,660,726 | 5/1972 | Ammon et al. | 174/68.5 X |
| 3,859,711 | 1/1975 | McKiddy | 174/68.5 X |
| 3,876,822 | 4/1975 | Davy et al. | 361/414 X |
| 3,953,924 | 5/1976 | Zahry et al. | 174/68.5 |
| 4,197,555 | 4/1980 | Uehra et al. | 357/68 X |
| 4,298,770 | 11/1981 | Nishihara et al. | 174/68.5 |
| 4,432,037 | 2/1984 | Brabetz | 361/410 |
| 4,438,660 | 3/1984 | Kisters | 174/68.5 X |
| 4,506,442 | 3/1985 | Alzmann et al. | 29/830 |
| 4,524,239 | 6/1985 | Rouge | 174/68.5 |

FOREIGN PATENT DOCUMENTS 1157432 7/1969 United Kingdom ................ 361/414

Primary Examiner—R. R. Kucia
Attorney, Agent, or Firm—Fliesler, Dubb, Meyer & Lovejoy

[57] ABSTRACT

Electrical circuitry 32 is comprised of a plurality of layers 30, 100, each layer 30, 100 including one or more electrical pathways 36, 38, each layer 30, 100 also including insulation 34 for insulating at least part of one layer 30 from another layer 100. The pathways 36, 38 comprise repeating patterns 40, 42. Each pathway 36, 38 of each layer 30, 100 can communicate with the pathways 36, 38 of the next adjacent layers 30, 100. Some portions of the patterns 40, 42 which comprise the pathways 36, 38 of each layer 30, 100 can be at least partially aligned with some portion of the patterns 40, 42 of pathways 36, 38 of the other layers 30, 100. Other portions of the pathways 36, 38 of the layers 30, 100 remain unaligned. A pulse laser 134 can be used to sever unaligned portions of the pathways 36, 38 as appropriate to create the desired electrical circuitry 32. Components can be secured to the electrical circuitry as required. Further, such circuitry can be used in the construction of the final metallization layers of chips such as gate arrays.

14 Claims, 29 Drawing Figures

ELECTRICAL CIRCUITRY

This application is a continuation of application Ser. No. 847,727 filed May 12, 1986, which is a division of Ser. No. 561,917, filed Dec. 15, 1983, both of which applications are now abandoned.

BACKGROUND OF THE INVENTION

The present invention relates to electrical circuits for interconnecting components such as microchips and also electrical circuits for the microchips themselves.

BACKGROUND ART

Circuit boards in mass production for consumer and commercial needs can be printed using silkscreen techniques. Even with routing programs and computer aided engineering, much time is needed to design, set up production lines for, and build such boards. The design and set up time requirement means that such boards can only be produced at competitive prices for orders of thousands and hundreds of thousands. The costs and time required for multi-layer board arrangements are even larger.

Accordingly, for custom orders of circuit boards a wire-wrap technique is generally used. In the wire-wrap technique, a base circuit board is produced which has a matrix of pins upstanding from one surface thereof and a matrix of connectors communicating with the pins and usually upstanding from the other surface of the board. The matrix of connectors are generally for mounting chip packages or carriers. The board may have certain basic electrical pathways predesigned therein which connect selected chip packages to each other or to terminals on the board for purposes of powering, grounding or signal communication requirements.

To develop a custom board using this arrangement, a circuit builder would use a wire-wrapping tool which would tightly wind a connecting wire around the appropriately selected pins to provide electric communication therebetween. Such a process is quite naturally slow and must be done with painstaking skill, otherwise incorrect pins may be communicated during the wire-wrap procedure.

It has been found that if pins are incorrectly communciated, many wires must be removed prior to reaching the incorrectly positioned wire. Also it has been found that during the wire-wrap procedure, the wire-wrap tool places stress on the wires such that in some instances the wire breaks inside the insulation making it impossible to find the break with visual inspection. Further as even the same operator will never wire two functionally identical custom boards in exactly the same manner, visual inspection is time consuming.

To assist in this wire-wrap process, there are some semi- automatic wire-wrap machines which provide pointers which move between the pins which are to be connected with the wires. The person who is using the wire-wrap tool will then appropriately communicate the pins with a wire. With this semi-automatic wire-wrap machine, up to four hundred wires per hours can be connected between appropriate pins. A standard five-inch by seven-inch board contains approximately a thousand pins of which seven hundred are generally connected during the wire-wrap operation. Thus, approximately two hours is required to wire the board. Fully automatic wire-wrap machines do exist which make up to twelve hundred connections per hour. Such machines are considerably more costly than the semi-automatic machines.

On a smaller but not less significant scale, the design and manufacturer of small orders of custom chips can be accomplished through the application of, for example, circuitry to gate array chips during the final metalization steps. With no more than one or two metalization layers are placed on the chip, the surface becomes rough and the electrical pathways themselves can become quite convoluted. As more layers are put on the chip, the roughness or three-dimensional effect of the surfaces becomes greater causing increased difficulty in properly focusing the various deposits which are placed on the chip so that they stay within the bounds intended by the circuit design.

Thus generally there is a need to provide electrical circuitry which can be easily fabricated for use with custom and small order designs both for circuit boards and chips.

The present invention is directed to overcoming these difficulties.

SUMMARY OF THE INVENTION

In one aspect of the invention, an electrical circuit comprises a plurality of layers, each including one or more electrical pathways, each layer including insulating means for insulating at least part of any one layer from another layer, with at least some of the electrical pathways having substantially repeating patterns and with at least the first and second layers having substantially the same repeating patterns. Each pathway of each layer comprises means for communicating with the pathways of the next adjacent layer. Some portions of the patterns, including the communication means, of one layer are at least partially aligned with some portions of the pattern including the communication means of another layer with the one layer moved and repositioned relative to the another layer and with other portions of the pattern remaining unaligned.

In yet another aspect of the invention, the electrical circuit can comprise a single layer including electrical pathways with repeating patterns.

The method of the invention includes providing an insulation base and then providing electrical pathways thereon which are comprised of regular and repeating patterns. The method further includes the step of selectively severing portions of the pathways to provide the desired circuit.

In another aspect of the invention, the pathways are severed by the use of a laser. The design of the patterns themselves is such that at points where it would be desirable to have the pathway severed, the pathways which are located on several layers are unaligned. Thus no matter what layer the pathway is on, the laser can easily access the pathway without interrupting any other pathway.

In another aspect of the invention, the electrical pathways include means for receiving pins of wire-wrap circuit boards. These means can accept the pins and provide a proper electrical contact with the pins.

In yet another aspect of the invention, first and second layers can be interconnected by a third layer of discrete nodes with communicating means. In this aspect, the positioning of the nodes is selected by a programmed photoplotter so that the appropriate pathways are communicated between the first and second layer. If all the nodes were selected, a regular grid would be established which would communicate with each communication means of the first and second layers. The photoplotter selects the appropriate nodes to complete the electrical circuit and only those are deposited on the third layer.

The present invention can be used with conventional wire-wrap printed circuit boards without the necessity of actually wire-wrapping the connections. The circuits are made using the severing technique indicated above and then one or more of the layers are urged onto the pins of the wire-wrap board. Thus the circuits are completed in a minimum of time as compared with the conventional wire-wrapping technique. Also it should be understood that if required, after the circuit of the invention is urged onto the wire-wrap board, that further connections can be made with the conventional wire-wrap techniques. The problems associated with wire-wraps such as the time involved in removing wires when a terminal is incorrectly connected, and the time involved in locating breaks hidden by the insulation due to the stress placed on the wire by the wire-wrap tool, are solved by this invention.

It should also be understood that the present invention can be used to replace conventional circuit boards which are used in other than a wire-wrap environment.

It is also to be understood that the present invention can be used for customizing microchips and for other chip carrier and chip package manufacture. With microchips, the various layers of the invention are laid down and then a laser used to sever the pathways as desired to create the desired electrical circuitry. As the layers are comprised of substantially repeating patterns, each layer is substantially level and thus there is less of a resolution problem or focusing problem which leads to improperly deposited materials. Also, there tends to be a reduction in the number of convoluted pathways which cross excessively between layers.

DETAILED DESCRIPTION OF THE PREFERRED EMBODIMENT

Figure 1:
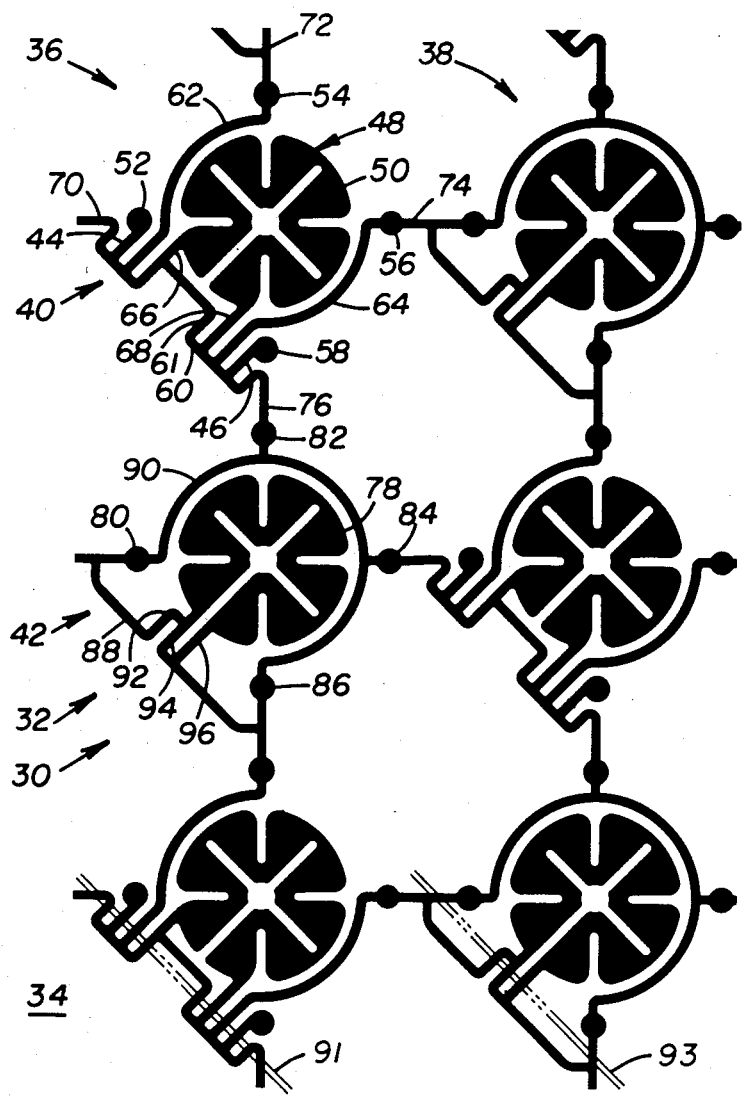
FIG. 1 depicts a layer of an embodiment of the invention with repeating electrical pathways.

With reference to the figures and in particular to FIG. 1, layer 30 of the electrical circuit 32 of an embodiment of the invention is depicted. Layer 30 is comprised of an insulation substrate 34 which can be comprised of a plastic as, for example, Kapton which is a polyimide of the thermo-setting variety which can be between one-half and five mils thick. This particular plastic was selected as it can be used during a soldering operation and will not melt, although it does tend to char. Electrical pathways 36, 38 defined on substrate 34. In a preferred embodiment, the electrical pathways 36, 38 are comprised of copper and are from one-and-one-eighth to one-and-one-half mils thick. In a preferred embodiment, these electrical pathways are configured by making a uniform deposit of copper onto the substrate 34 and then, using photomask and etching techniques, removing the undesired copper to leave the electrical paths 36 and 38. As can be seen in FIG. 1, these electrical paths are comprised of repeating patterns which include different patterns 40 and 42. Pattern 40 is similar to pattern 42, however, it includes several more electrical traces such as traces 44 and 46 than does the pattern 42. In fact, a substantial amount of the pattern 40 can be superimposed over and aligned with the pattern 42, with only some of the patterns being nonalignable, such as for example, the traces 44 and 46 and the traces that are located on either side thereof. As is evident from FIG. 1, electrical path 36 is first composed of pattern 40, then pattern 42, and then repeats pattern 40 and can continue in that arrangement. Pathway 38 is first composed of pattern 42, then pattern 40, and then repeats pattern 42 and can continue in that arrangement.

Pattern 40 is comprised of a center flower-shaped communication means 48 through which a pin of, for example, a wire-wrap circuit board can be inserted so as to expand the flower without breaking any of the traces and allow for electrical communication between the pathway and the pin. As can be seen in FIG. 1, the flower is composed of eight substantially identical wedge-shaped sections 50, pairs of which are joined together at the center to form quarter sections of the flower, with the quarter sections of the flower being joined together at the periphery of the flower to form the entire flower. Due to this wedge-shaped arrangement, the center of the flower can be pushed out or expanded without disturbing the electrical connection between the wedge-shaped sections. The pattern 40 further includes other communication means which include nodes or junctions 52, 54, 56 and 58. These nodes are placed at 90° intervals about the flower-shaped communication means 48. Pattern 40 further includes a baseline trace 60 which communicates with nodes 52 and 58 by previously indicated traces 44 and 46. Nodes 54 and 56 communicate with baseline trace 60 by traces 62 and 64, which are arcuate in nature and extend about the flower-shaped communication means 48, but which are substantially parallel to the traces 44 and 46 as traces 62, 64 approach the baseline trace 60. Further, traces 66 and 68 communicate the flower-shaped communication means 48 with the baseline trace 60. As will be discussed further herebelow, nodes 52 through 58 include blind vias which provide communication between the various layers of the electrical circuit of the invention, which layers may be situated above or below the layer as depicted in FIG. 1. Plated through holes can be substituted for the blind vias. It is to be understood that the flower-shaped communication means do not communicate with the other side of the insulation substrate material as the nodes with the vias do.

Further, pattern 40 includes interconnecting means, such as traces 70, 72, 74 and 76 which interconnect pattern 40 with the other adjacent patterns 42 to form a matrix of patterns 40 and 42.

Figure 2:
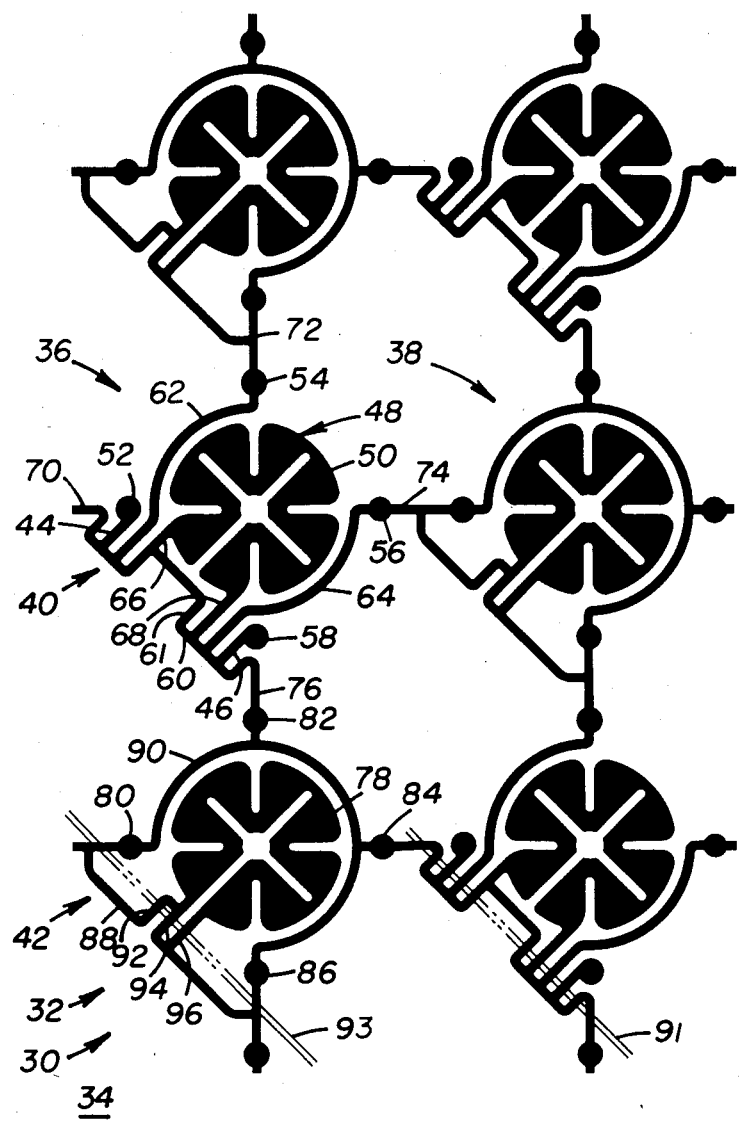
FIG. 2 depicts the electrical pathways of FIG. 1 with a laser path described thereon.

Pattern 42 is comprised of a similar flower-shaped communication means 78 with nodes 80 through 86 and baseline trace 88. Nodes 80, 82, 84 and 86 all communicate with a common trace 90 which is described about the flower-shaped communication means 78 and which communicates with baseline trace 88. The flower-shaped communication means 78 also communicates with baseline trace 88 through traces 92, 94 and 96. As is evident from the figures, traces 92, 94 and 96 of pattern 42 are substantially parallel, as are traces 44, 46, 66, 68, 61 and portions of traces 62 and 64 of pattern 40. The traces of pattern 40, lie along a laser cut path such as cut path 91 in FIG. 2. These traces are substantially perpendicular to this cut path 91. The same is true with the parallel traces of pattern 42. They lie along a laser cut path 93.

Figure 3:
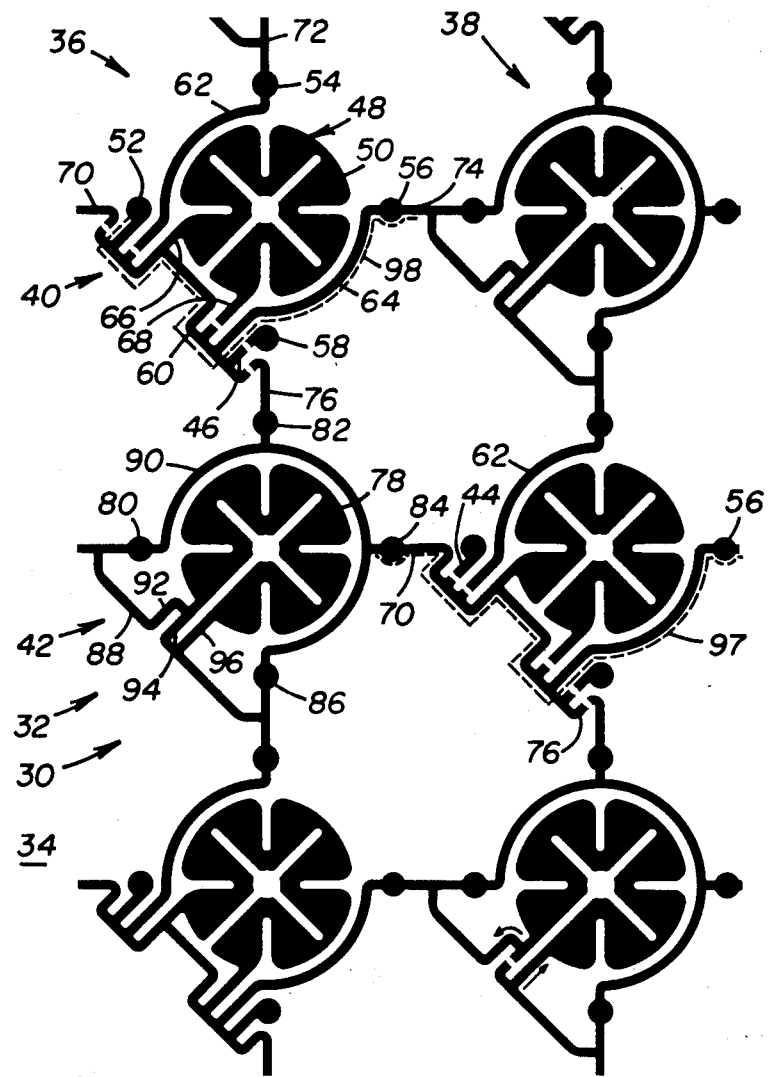
FIG. 3 depicts the electrical pathway of FIG. 1 with select pathways severed.

As will be more fully described hereinbelow, the electrical circuitry of the invention can be fabricated from the pathways 36 and 38 by selectively severing one or more of the portions of the traces which fall within the laser cut paths 91 and 93 by using a programmed and pulsing laser. As for example, in FIG. 3 and in pathway 38, and pattern 40, if it is desired to communicate node 56 with interconnecting trace 70, the laser would sever traces 44, 62, 68 and 46 and interconnecting trace 76. This altered pathway is shown by dotted line 98 which is included for clarity only and does not comprise a portion of the circuit. Similarly, if it is desired to communicate a node such as node 56 with node 84, the appropriate traces are severed, as shown in FIG. 3, and line 97, which again is not part of this circuit but which is included for clarity only, shows the pathway which connects node 56 with node 52.

While it is to be understood that single layers may be used for the complete electrical circuitry, it is also the intent of the invention to use multiple layers such as layer 30 to comprise the electrical circuitry of the invention. Thus multiple parallel layers, although identical in pattern and pattern arrangement, can be moved with respect to each other to form circuits in the third dimension. The movement of the layers with respect to each other can be by translational or rotational or mirror image moves, with the mirror imaging of the electrical patterns produced on the reverse side of the layer. The moves can also be combinations of all three of these types of moves.

Figure 4:
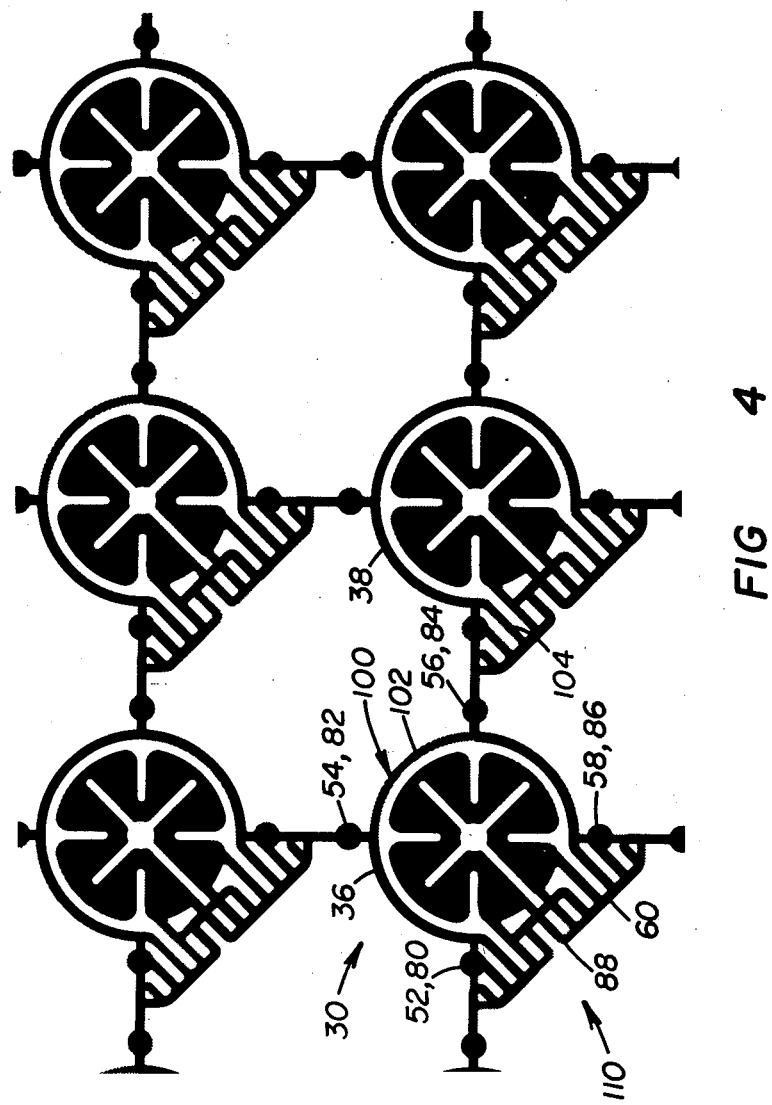
FIG. 4 depicts the electrical pathways of FIG. 1 moved one position to the right and superimposed on a second layer which is identical to the pathway configuration in FIG. 1.

FIG. 4 depicts a translational movement of the electrical pathways 36 and 38 of the layer 30 of FIG. 1 to the right and positioned over a second layer 100 which includes pathway 102 and 104 which are identical to pathways 38 and 36 respectively. Thus in effect, a pathway similar to pathway 36 is placed over a pathway similarly to pathway 38. As can be seen in FIG. 4, a great majority of the patterns of the two pathways are substantially aligned with, for the most part, the traces which are parallel and communicate directly with baseline trace 60 and baseline trace 88 being nonaligned. In fact, there is no overlapping or aligning of the parallel traces which are directly connected to these baseline trace 60 and 88. The reason for this is that these traces lie on the laser cut paths such as cut paths 91 and 93 in FIG. 2, and thus the laser can be pulsed to selectively sever any one of these traces without severing a trace lying thereunder.

For the pattern in the lower left-hand corner of the electric circuitry in FIG. 4, pattern 40 is imposed upon pattern 42. Nodes 52, 54, 56 and 58 of pattern 40 communicate with nodes 80, 82, 84 and 86 of pattern 42. Again these nodes include blind vias which communicate the nodes of the adjacent layer.

Figure 5:
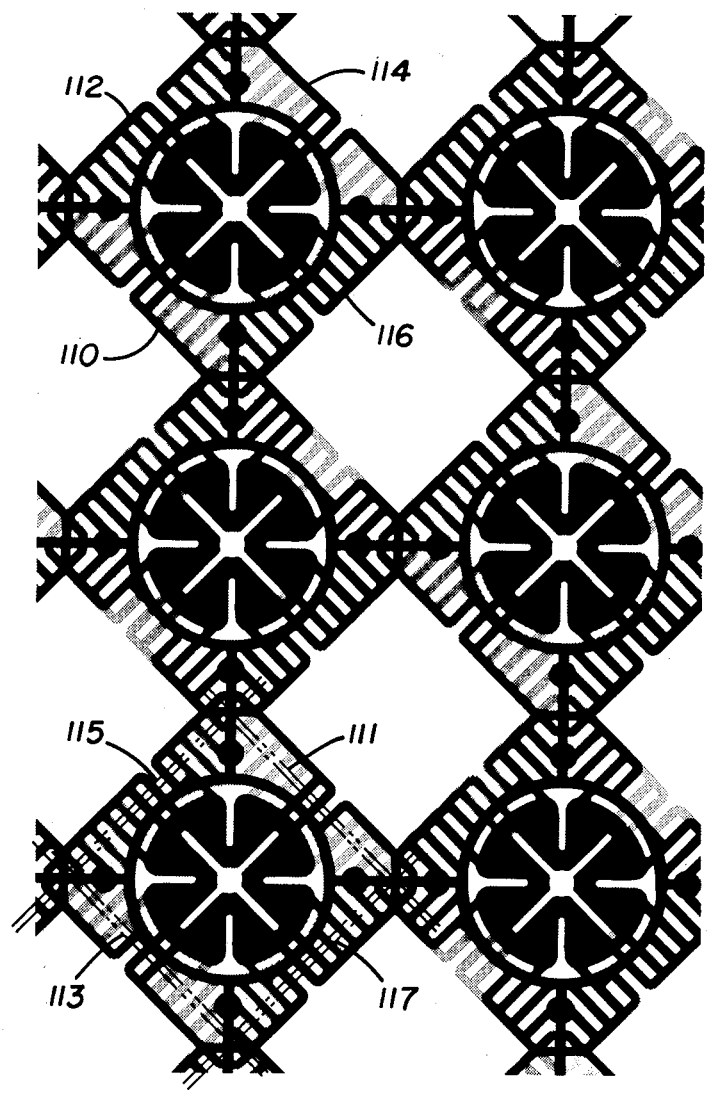
FIG. 5 depicts eight layers superimposed on each other, the two layer set of FIG. 4 providing the base with three similar sets being rotated 90°, 180° and 270° with reference to the base and aligned under the base.

For purposes of identification, the set of first layer 30 and second layer 100 in FIG. 4 is identified as 110 and is so indicated in FIG. 5. FIG. 5 includes eight layers of pathways which are identical to the first layer which is shown in FIG. 1. Each of these layers is rotated or translated with respect to the first layer 30. To more conveniently describe FIG. 5, the set of layers 110 in FIG. 4 is so identified in FIG. 5 and similarly positioned. The other six layers are comprised of two layer sets which are similar to FIG. 4 but which have been rotated 90°, 180° and 270° from the first two layer set 110. These sets are identified as 112, 114 and 116 respectively.

Figure 6:
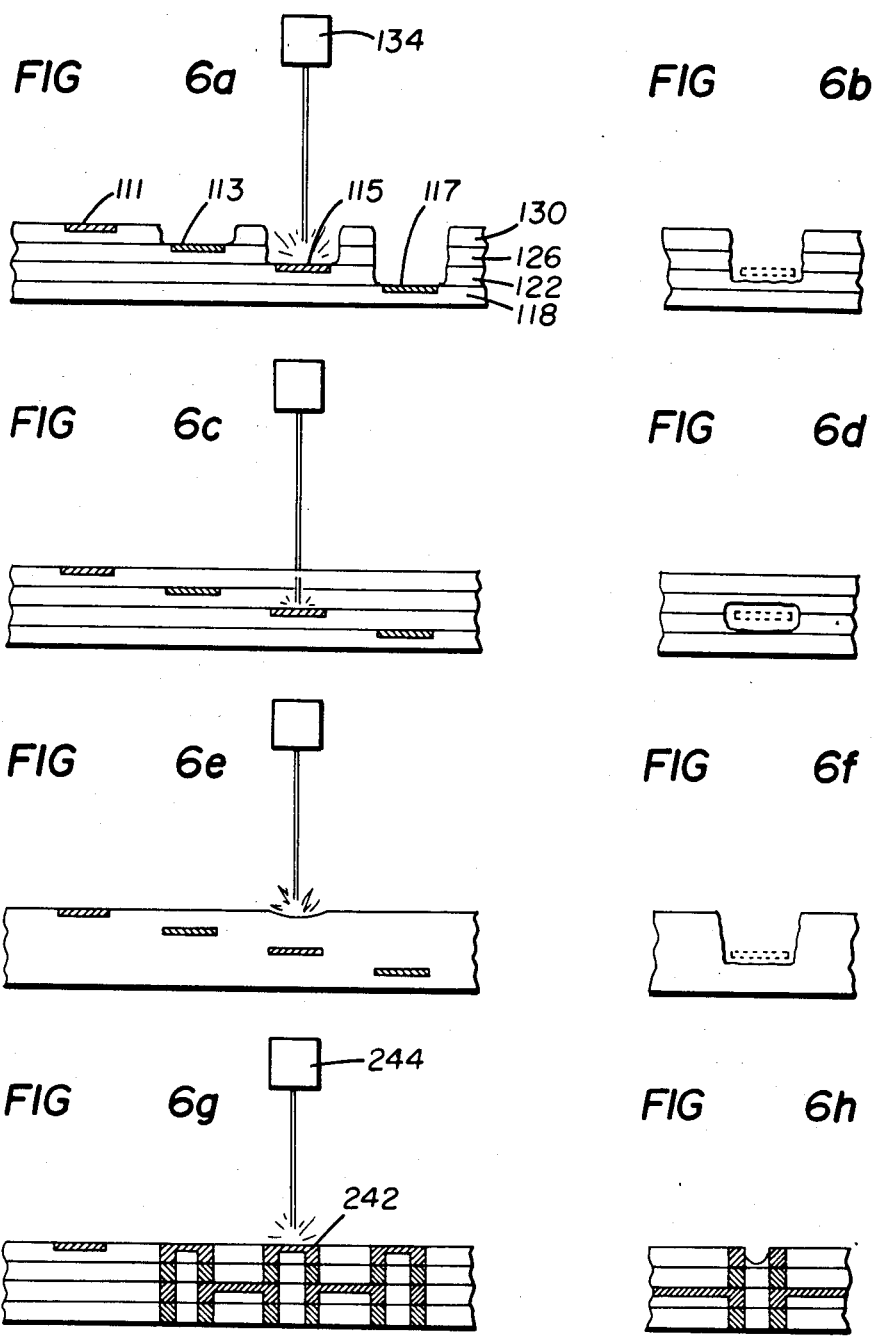
FIG. 6a through 6h depict several methods of severing the pathways.

The electric circuitry of the invention can be fabricated in one of several ways. As shown in FIG. 6a and b, the circuitry is composed of four layers, 118 through 132. The cross-section shown is to be taken along a laser cut path. The traces in the laser cut path are identified by the number 111, 113, 115 and 117.

These traces are parallel and unaligned. In this arrangement, the layers which are located above each of the traces have a window provided therein so that there is an open column above each of the traces. A laser such as laser 134 can be positioned above the appropriate trace and used to sever that trace, as is indicated in FIG. 6b.

The laser is controlled by a writing program which can be selectively programmed according to the circuitry requirements so that the laser pulses and severs the appropriate traces.

The same arrangement is shown in FIG. 6c with no windows provided above the traces to be severed. In this situation, the substrate would be transparent to the laser emission which would selectively sever the appropriate trace as shown in 6d. It is also possible to have a laser of one wavelength used to burn a hole in the substrate and then have a laser of a different wavelength used to sever the trace. With respect to FIGS. 6e and f, a laser is provided for simply burning through the substrate and the trace with one blast. Again it is to be remembered that circuitry including a single layer can be made in the above manner.

Figure 7:
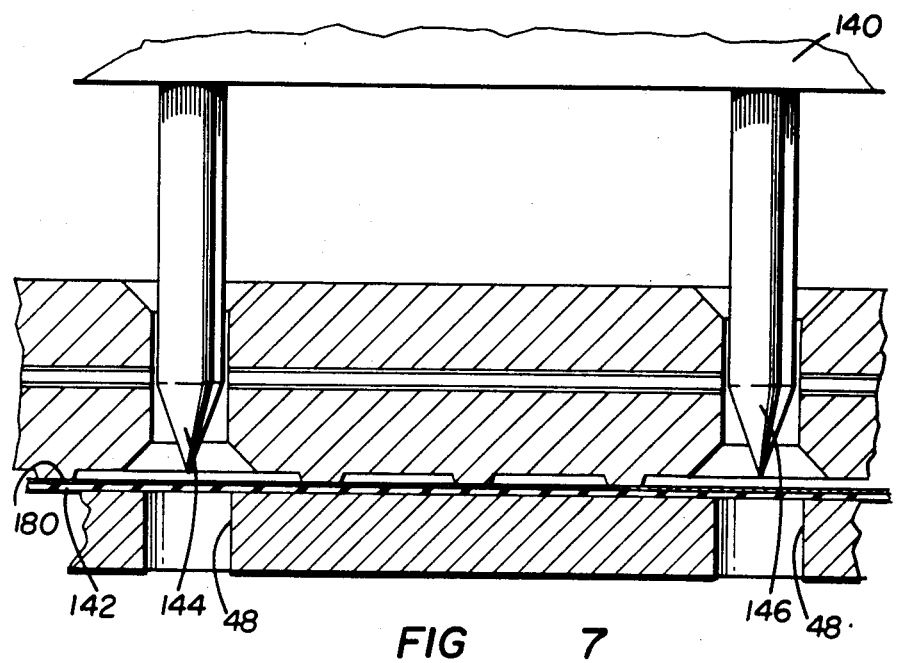
FIG. 7 depicts pins of a wire-wrap circuit board positioned above the electrical circuitry of the invention.
Figure 8:
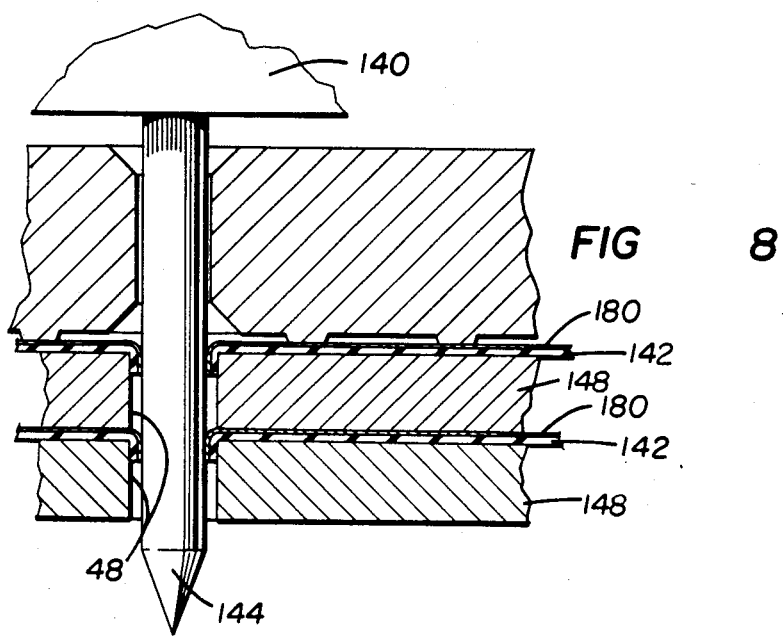
FIG. 8 depicts several layers of the electrical circuitry of the invention being in engagement with a pin of the wire-wrap circuit board.
Figure 9:
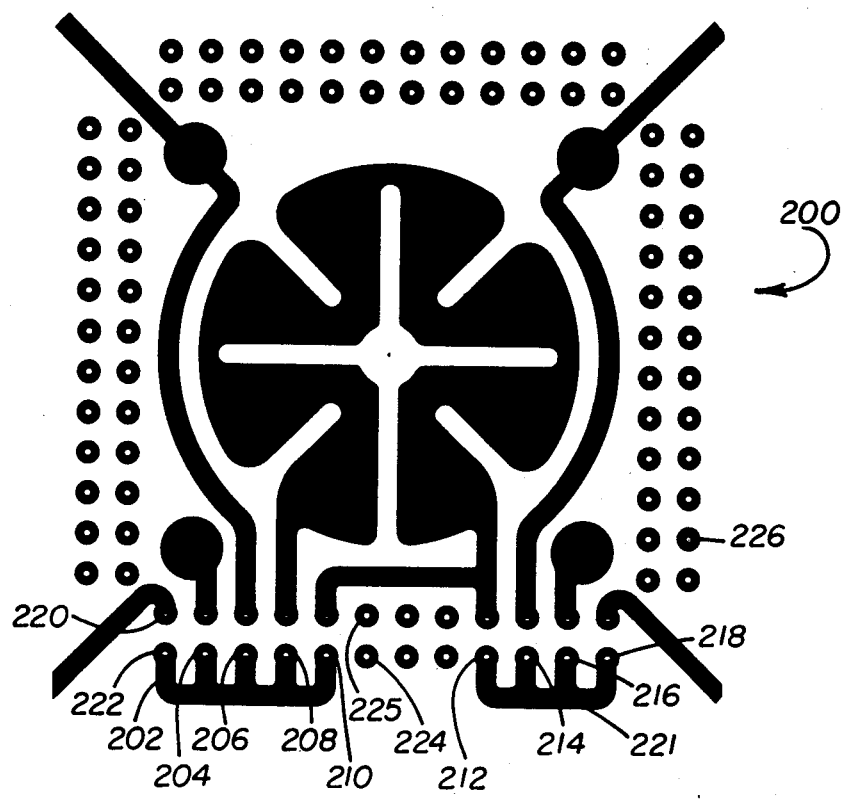
FIG. 9 depicts an another embodiment of the pathway of the electrical circuit with several of the pathways pre-severed.

Once one or more layers of the the circuitry is completed and appropriate traces are severed, a circuit board which is used for wire wrapping purposes, such as board 140 in FIG. 7, is positioned over the first layer 142 of this circuit with the pins 144, 146 positioned above the centers of the flower-shaped communication means such as means 48. A backer board 148 is positioned underneath the layer 142 or can be initially associated with the layer. The pins are forced down into communication with and pierce the flower-shaped communication means so that good contact is made (FIG. 8). This simple process eliminates the entire need for using the prior art wire-wrap technique. However, it is to be understood that should additional circuits be required in the board, that the traditional wire-wrap technique can be used in combination with circuit board 142 by simply wrapping the wires around the pins 144 and 146 which extend beyond layer 142.

It is to be understood that the backer board can be removed and additional layers can be forced onto the wire-wrap pins with the backer board left on with the last layer. Also the backer board can be left on with each layer. Further it is to be understood that the fit between the backer board and the pin is essentially a forced fit with the pin being rectangular or circular and larger than a circular hole being provided through the backer board. As the cover deposit 150 is on the upper surface of each layer 142 the pathways are placed in intimate contact with the pin during this force fit.

It is to be understood that this embodiment can be used to provide electrical circuitry without the use of wire-wrap boards as is contemplated by some of the following embodiments.

Figure 10:
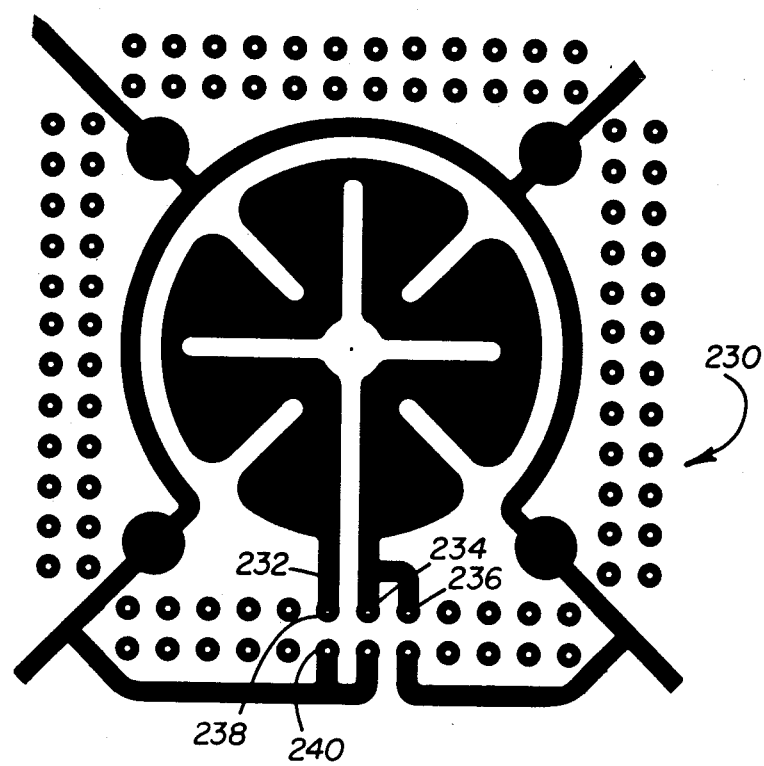
FIG. 10 depicts a different configuration of the pathway of the embodiment of FIG. 9.
Figure 11:
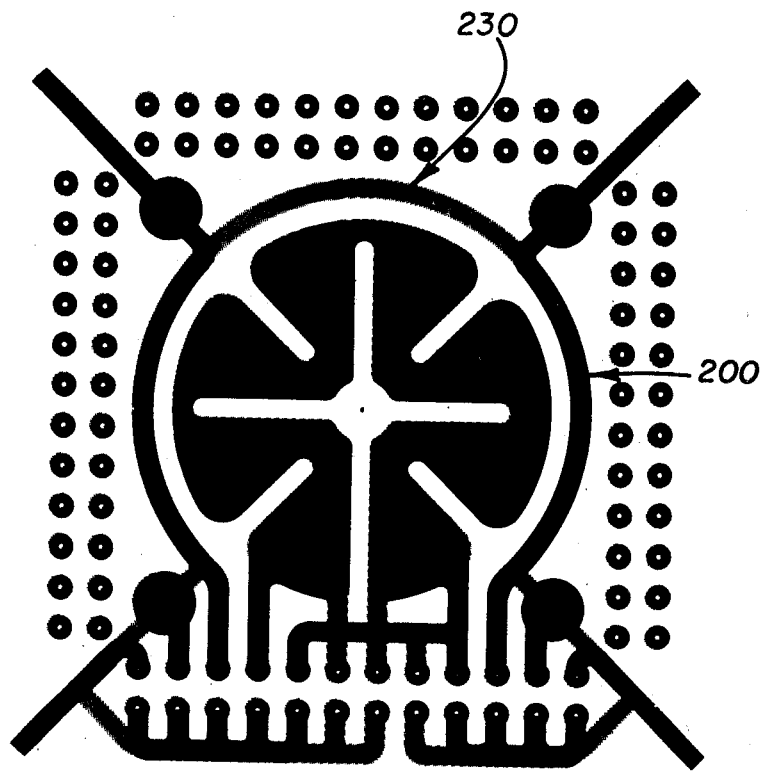
FIG. 11 depicts the alignment of the layer of FIG. 9 over the layer of FIG. 10.
Figure 12:
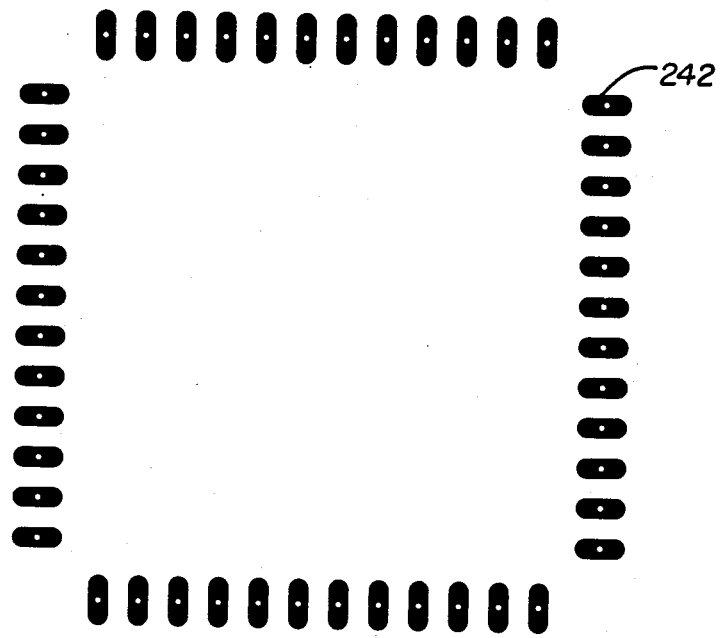
FIG. 12 depicts a matrix of electrical shunts which are used with the invention of FIG. 11.

Another embodiment of the invention is shown in FIGS. 9 through 12. This embodiment includes a first pattern 200 which is similar to pattern 40 in FIG. 1 except for the fact that the parallel traces 202 through 218 are severed or have a discontinuity with nodes such as nodes 220 and 222 defining each end of the discontinuity. These nodes include plated through holes which communicate with the other side of the insulating material. Blind vias could also be used. This pattern additionally includes free nodes such as nodes 224, 225, and 226 which relay communication with other patterns of other layers. FIG. 10 depicts a pattern 230 which is substantially similar to pattern 42 of FIG. 2. Pattern 230 includes traces 232, 234, and 236 which are discontinuous and which have nodes such as nodes 238 and 240 which include plated through holes. With the pattern of FIG. 9 imposed upon the pattern of FIG. 10 as depicted in FIG. 11, a substantial amount of the patterns are aligned, with the unaligned portions remaining the traces as in the previous embodiments. It is to be understood that the free nodes 224 and 225 of the pattern 200 in FIG. 9 align with the nodes 238 and 240 at the end of the discontinuous trace 232. The nodes at the discontinuous traces and the free nodes form columns which communicate to the upper surface of the last layer. The final layer, which includes a plurality of discrete shunts such as shunt 242 (FIG. 12) and which included blind vias or plated through holes, is then placed on top of the upper layer of the previous layers of patterns in order to complete the circuitry. A laser such as laser 244 can selectively sever the isolated shunts such as shunt 242 without having to penetrate the remaining layers as shown in FIG. 6h.

With the exception of the above indicated discrete shunts, the construction and method of use of this embodiment of the invention is identical to the embodiment shown in FIGS. 1 through 5.

It is to be understood that in both of these embodiments, the layers can perform if desired a separate function. For example, one layer can essentially provide voltage, while another layer can be a ground plane. Other layers can be exclusively signal layers. Further it is to be understood that as the layers are relatively thin and as the electric circuit which is comprised of one or more layers is itself relatively thin, redundant circuitry can be built into a system with relatively little cost and small space requirements, simply by adding redundant layers.

Figure 13:
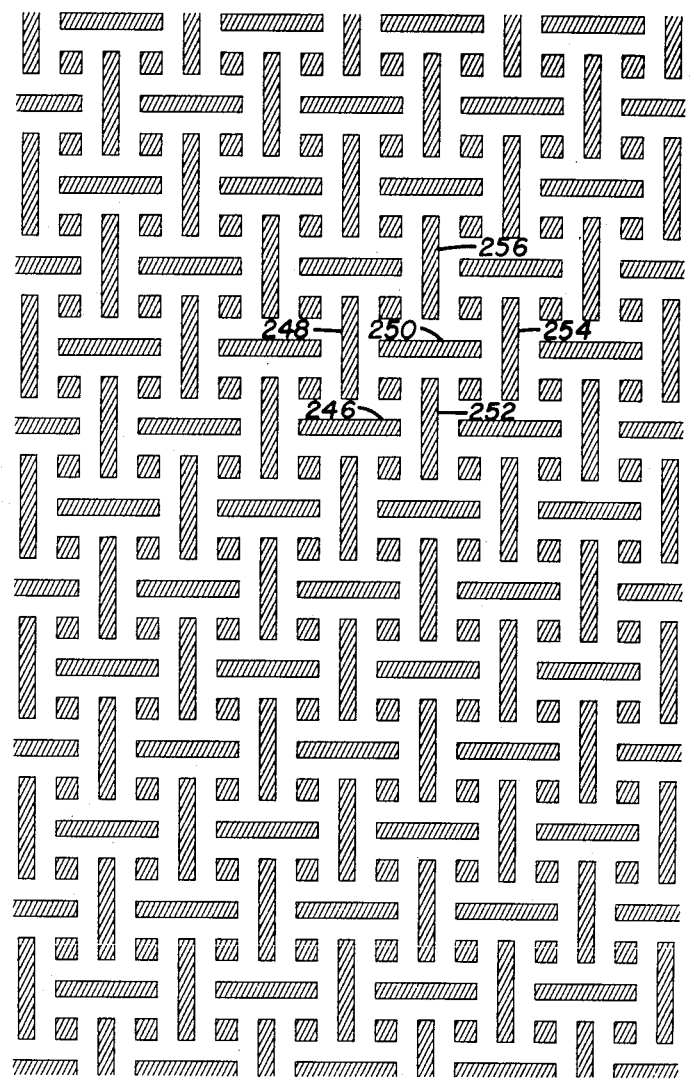
FIG. 13 depicts a layer of electrical pathways in accordance with another embodiment of the invention.
Figure 14:
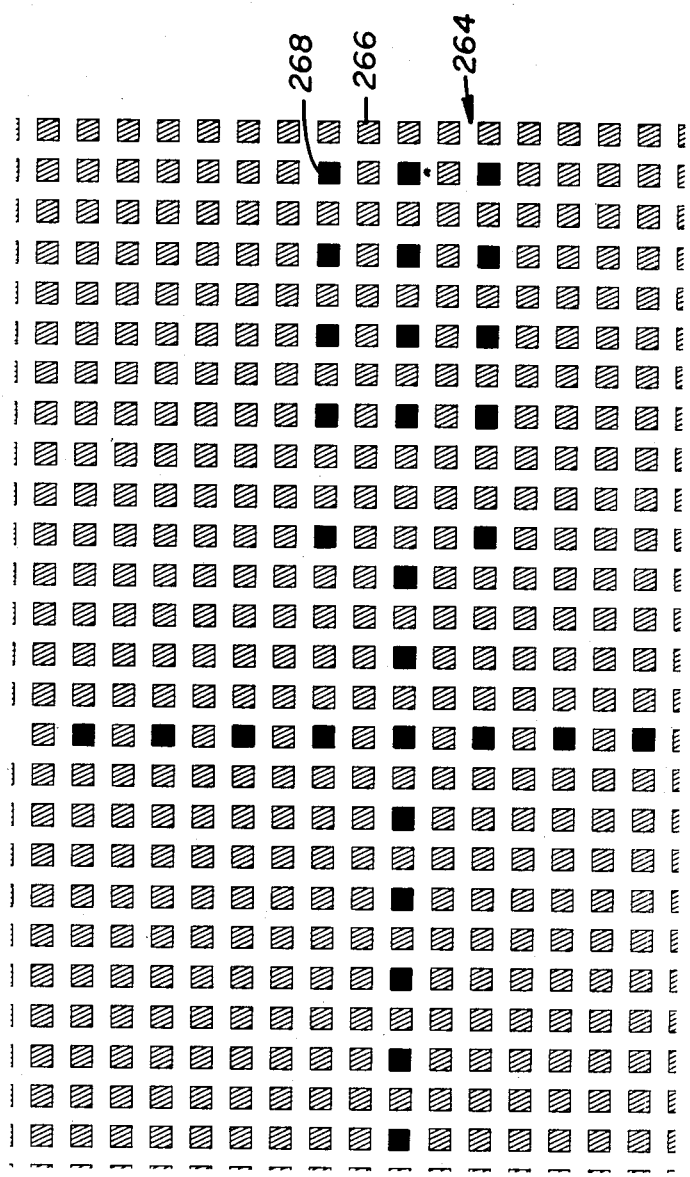
FIG. 14 depicts a layer of a plurality of nodes in accordance with the embodiment of FIG. 13.
Figure 15:
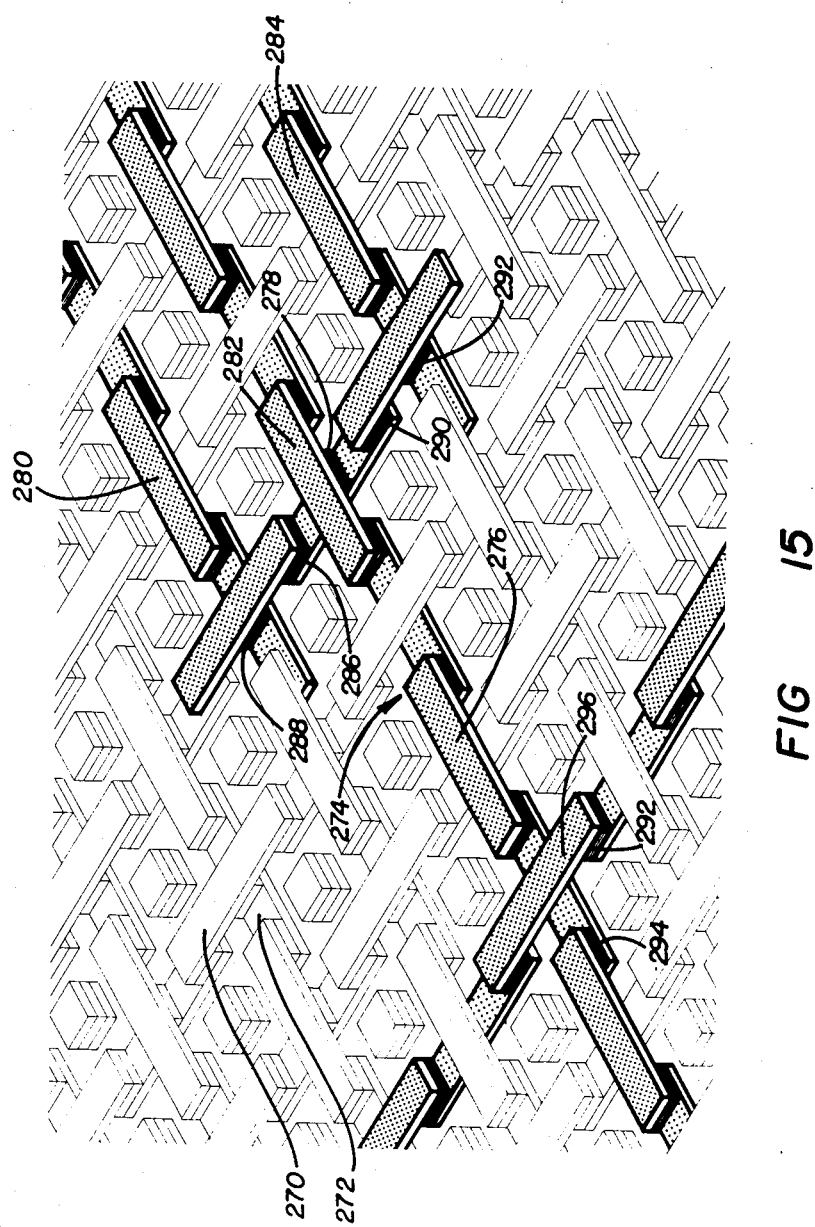
FIG. 15 depicts a perspective view of the electrical circuit comprised of the layers such as depicted in FIGS. 13 and 14.

Another embodiment of the invention is shown in FIGS. 13, 14 and 15. This embodiment includes a first layer which has a substrate of an isolation material upon which is deposited discrete isolated pathways, such as pathways 246, 248, 250, 252, 254 and 256. Pathways 248, 252, 254 and 256 are essentially straight parallel pathways, and pathways 246 and 250 are straight parallel pathways, with pathways 246 and 250 substantially perpendicular to the above pathways. Interspersed between the pathways are nodes which include node 258 and 260 which are shown as blind vias but which could be plated through holes. It is to be understood that many other patterns of pathways can be constructed for all or some of the layers of multilayer circuitry, as for example, having each discrete pathway be replaced by two similar and parallel isolated pathways and be within the scope and meaning of the invention. All of the other layers which comprise the circuitry of this embodiment can be comprised of the identical same pattern as is provided on the layer in FIG. 13, but which have been displaced through translation, rotation, or mirror imaging relative to the layer shown in FIG. 13.

In this embodiment, an intermediate layer between any two layers such as constructed in accordance with FIG. 13 is provided to communicate between these two layers. Such an intermediate layer is shown in FIG. 14. FIG. 14 is essentially comprised of a matrix of potential locations which can have copper deposited thereon through use of masks made from a photoplotter, which are used to communicate the layer immediately thereabove with the layer immediately therebelow. The dotted lines indicate areas where no copper was deposited but where copper could be deposited in order to make the various communications. The solid squares indicate where copper was deposited.

FIG. 15 shows a circuit comprised of three layers, the upper layer 270 being identical to the layer of FIG. 13, and the lower layer 272 being identical to the layer 270, but translated and repositioned with respect to upper layer 272 to form, with the cooperation of the pattern of FIG. 14, which forms the intermediate layer, certain pathways. As can be seen in FIG. 15, two separate and discrete pathways are formed. The first pathway 274 includes a first trace 276, which through node 278 acts as a junction and fans out to three traces, 280, 282 and 284. Nodes 286 and 288 and also 290 and 292 which are defined in the pattern of FIG. 14 provide the necessary communications between the upper layer 270 and the lower layer 272 to accomplish the fan-out from a single trace to three traces. In this embodiment, as is evident, no laser cutting is required.

A second pathway 292 crosses the pathway 274. This second pathway 292 is formed in the same way as pathway 274 in that the isolated shunts of each of the upper and lower layers are connected through the nodes of the intermediate layer. Where the pathway 274 and 292 cross, no node is formed immediately between the discrete shunts 294 and 296. Thus second pathway 292 does not communicate with pathway 274.

As is evident from FIG. 15, the nodes, which are located between the shunts, only communicate with the nodes of other layers. These nodes can be all communicated through a common ground plane and can form shields between the various circuits.

An electronic circuit of the invention using this embodiment can be fabricated in the following way. First, layers similar to the layer in FIG. 13 are made much in the same way the layers in FIG. 1 are made. Then a photoplotter is used to provide the necessary mask to make the layer in FIG. 14, according to the circuitry desired, which is then fabricated similarly to FIG. 1. The layers are then mated, and the mated layers forming the electrical circuits are in turn mated to a circuit board to which can be mounted the chips and other components of the circuit. Additionally if the required, the chips, or packages or carriers can be mounted directly to the upper layer of the electrical circuitry.

Further it is to be understood that layers similar to those in FIGS. 13, 14 and 15 can be used for producing the final metallization layers of for example a gate array. As each layer is substantially uniform, these metallization layers are less rough than those currently used in gate array technology, and thus the focusing and deposition problems which occur after two metallization layers have been deposited on the gate array are of little significance. Further there is less likelihood that any of the circuits will have to snake around excessively in order to provide the necessary connections. These layers would be made using standard fabrication techniques known in the industry.

Figure 16:
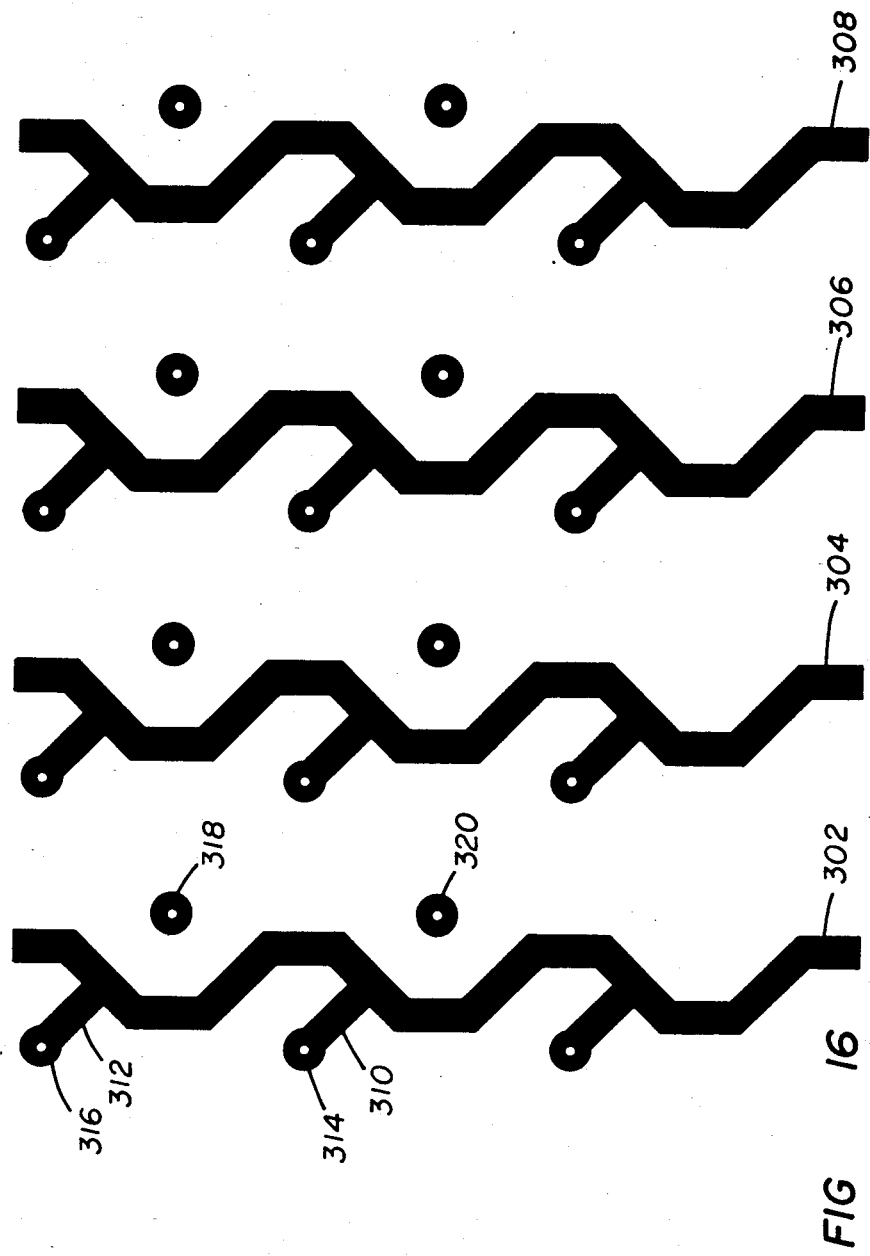
FIG. 16 is yet another embodiment of the present invention.
Figure 17:
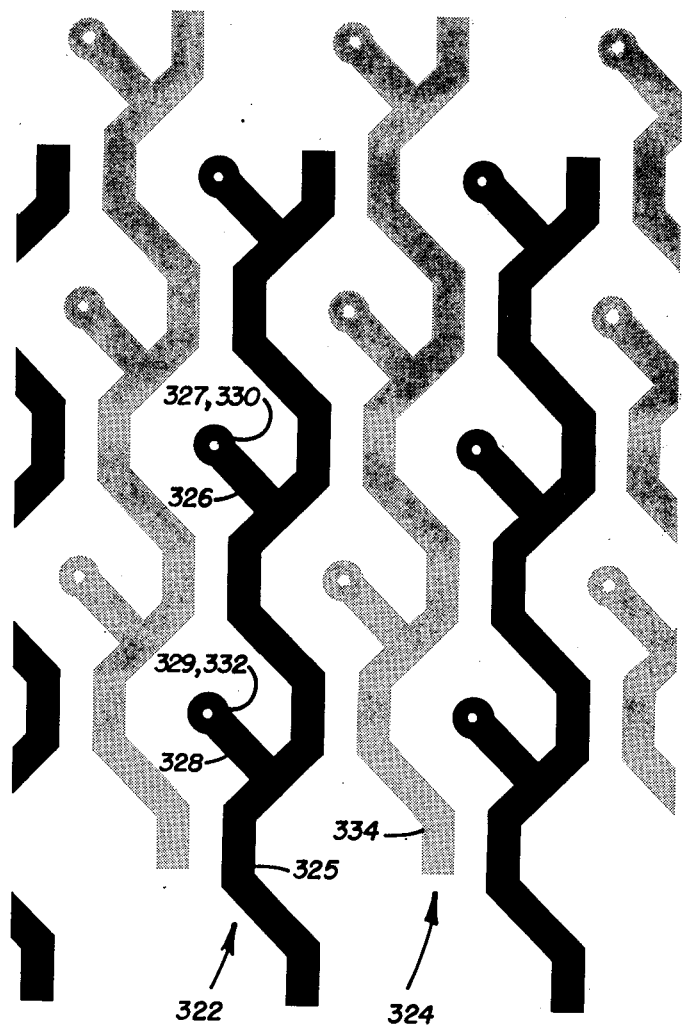
FIG. 17 depicts the layer of the invention of FIG. 16 translated and superimposed over a similar layer.
Figure 18:
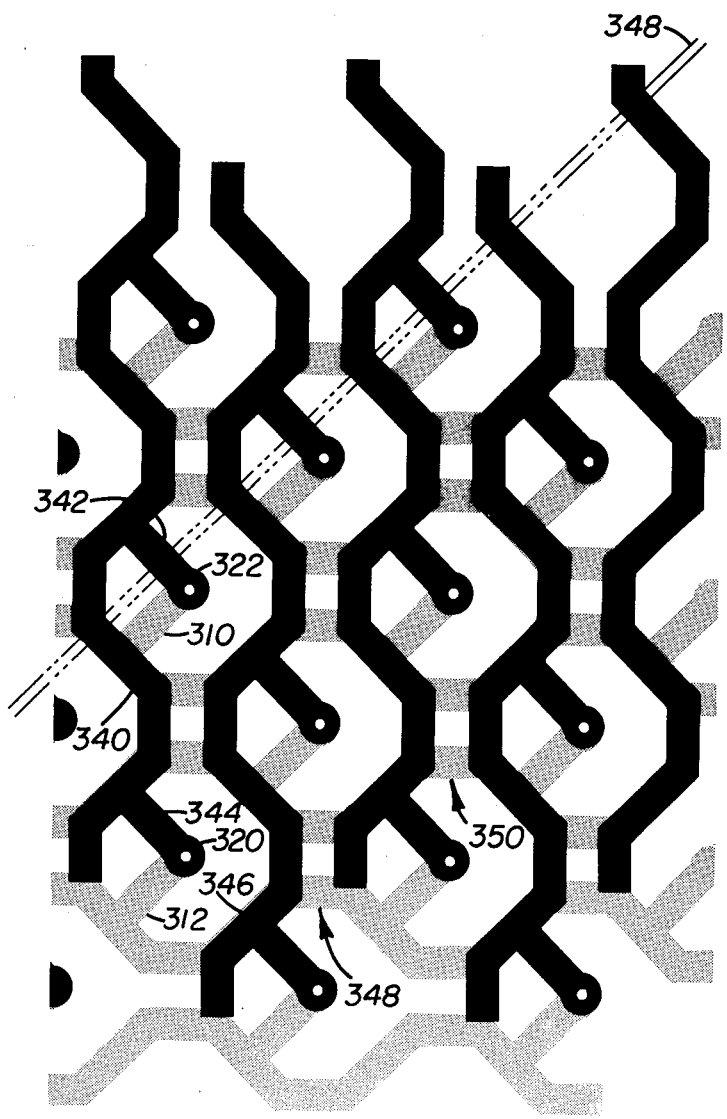
FIG. 18 depicts the two-layer configuration of FIG. 17 used as a base with a separate two-layer configuration rotated by 90° and aligned with the base configuration.

In another embodiment of the invention as shown in FIGS. 16, 17 and 18, the first layer is comprised of a plurality of identical and continuous but isolated pathways 302 through 308. Each of these pathways is comprised of repeating S-shaped patterns. Each pathway includes a projecting trace such as traces 310 and 312, which include at the end thereof nodes such as 314 and 316 with plated through holes which communicate with the other surface of the layer. Located opposite each of the projecting traces such as traces 310 and 312 are isolated nodes such as nodes 318 and 320. Each of these nodes includes a plated through hole which communicates with the other surface of the layer.

FIG. 17 includes a composite of a first layer 322, which is composed of traces which are oriented in a manner similar to those in FIG. 16, which is superimposed on a second layer 324 which is similar to the layer of FIG. 16 but which has been translated over and up in order to form substantially hourglass patterns between the two layers. It is noted that the projecting traces 326 and 328 with the associated nodes 327 and 329 of the pathway 325 of the first layer 222 communicate with the isolated nodes 330, 332 of the pathway 334 of the second layer 324.

In FIG. 18 a two-layer configuration of FIG. 17 is used as a base configuration 340 with projecting traces 310 and 312. This configuration is superimposed over another configuration which is similar to FIG. 17 but which has been rotated by 90° and includes projecting traces 342 and 344 which communicate with the other traces 310 and 312 with the appropriate nodes such as nodes 320, 322. This arrangement of four layers of pathways such as pathway 302 in FIG. 16 produces an alternating pattern of large octagons 346 and adjacent squares 348.

As depicted in FIG. 18, no two traces such as traces 310, 312, 342 and 344 are located under or over another trace, and all these traces describe laser cut paths such as cut path 348. Thus a laser can be used to selectively sever the traces to form the appropriate electrical circuitry. Also it should be understood that the sections of the pathways which form the squares such as square 348 are all on separate layers and also that they are not aligned within the other pathway which is located above or below. Thus these portions of the pathways are prime for being severed, if required, by a laser.

Such circuitry is principally used in non-wire-wrap situations, although with the addition of the flower-shaped communication means located in the octagonal portions, wire-wrap board usage is made possible. Again, as with the previous embodiment, this embodiment can be used to construct the metallization layers of a gate array.

Figure 19:
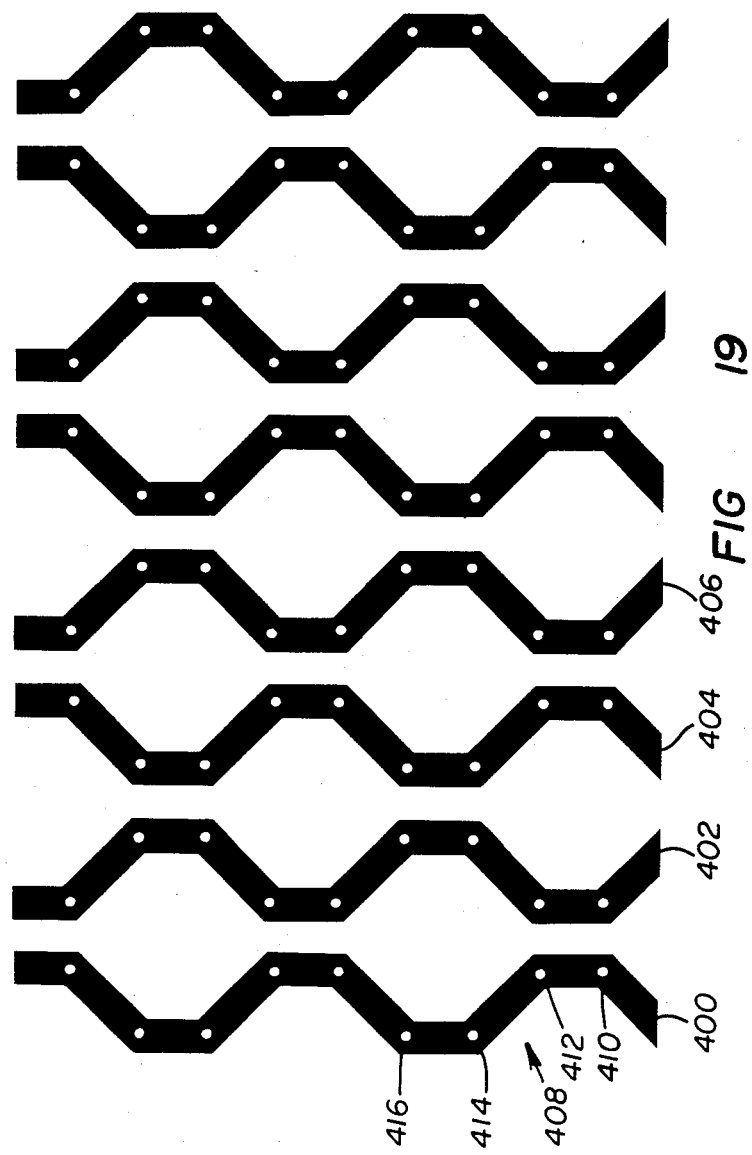
FIG. 19 depicts another embodiment of the invention wherein a single layer has pathways which are somewhat similar to the two-layer combination of pathways in FIG. 17.

FIG. 19 is similar to FIG. 17 except for the pathways 400, 402, 404 and 406 that are all located on the same layer. Further nodes which include plated through holes are located at every position where the pathways change direction. As, for example, one S-shaped portion 408 of pathway 400 includes nodes 410, 412, 414 and 416.

Figure 20:
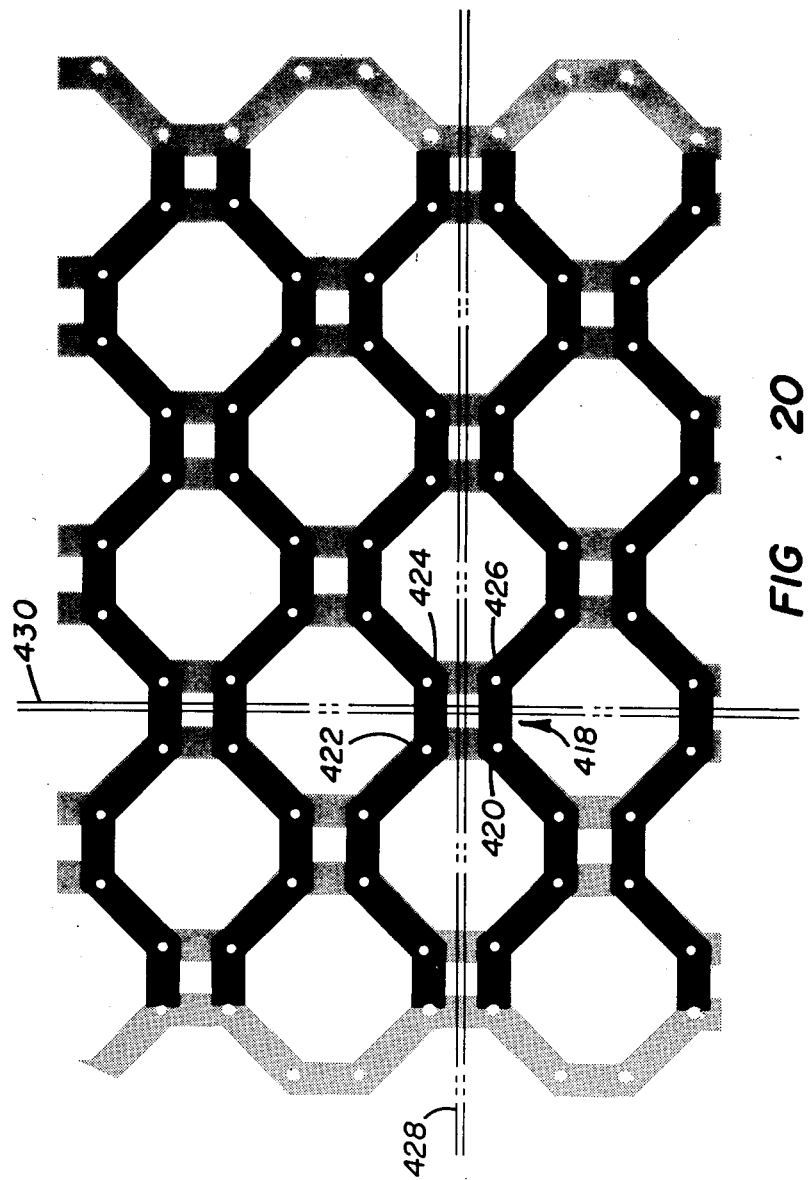
FIG. 20 is a combination of two layers, a base layer similar to FIG. 19 which is superimposed over a similar layer which has been rotated by 90°.

The configuration of FIG. 20 is quite similar to that of FIG. 18, with each square configuration, such as configuration 418, having a node, such as nodes 420 through 426, at each corner, which allow these two layers to communicate with each other. As in the embodiment in FIG. 18, laser cut paths, such as 428 and 430, can selectively sever the portions of the pathways which are located between the nodes to create the various desired electrical circuitry. Again it should be noted that none of the portion of the pathways which are located between these nodes are aligned with any other pathways. Thus the laser can conveniently sever that portion of a pathway without interrupting any other pathway.

Figure 21:
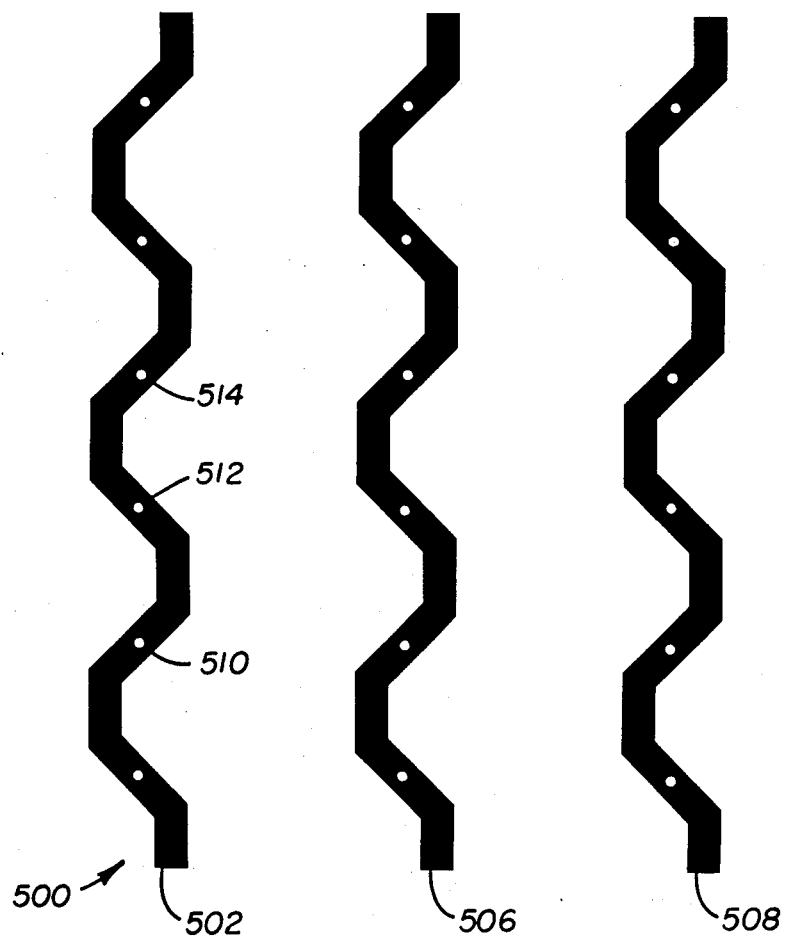
FIG. 21 is yet another embodiment of the present invention.
Figure 22:
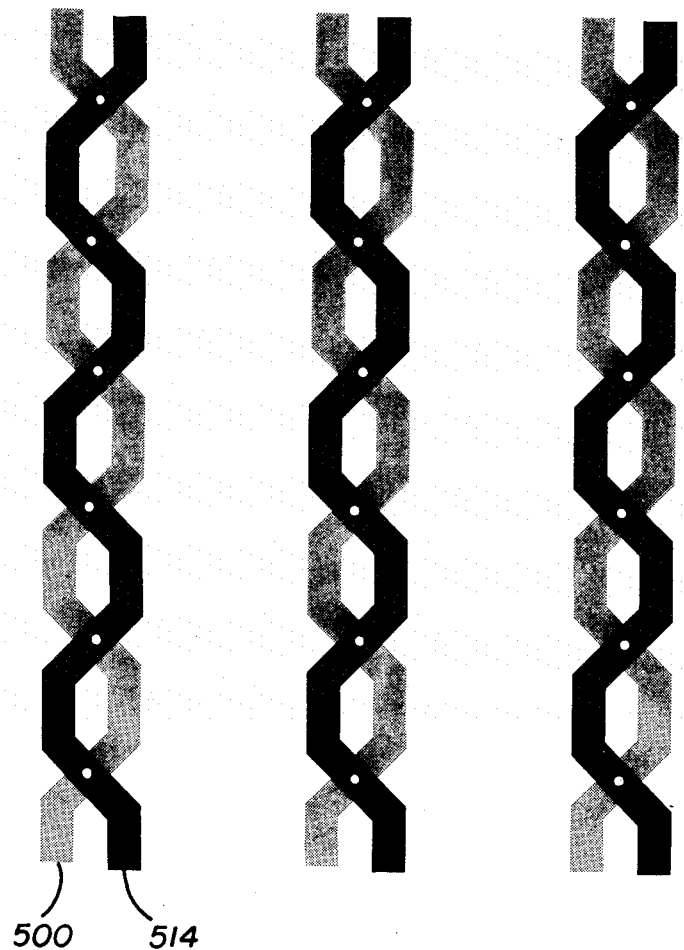
FIG. 22 is an embodiment of the present invention with the pathways of FIG. 21 superimposed over a layer of pathways which are comprised of a mirror image of the pathways of FIG. 21.

Finally the embodiment as shown in FIGS. 21 and 22 includes a first layer 500 which has pathways 502, 506 and 508. Each pathway includes selected nodes such as nodes 510, 512 and 514 which occur on the slanted portions of the S-shaped pattern. This type of an arrangement is especially useful for mirror imaging, as is shown in FIG. 22. In FIG. 22, the first layer 500 is superimposed upon a second layer which is comprised of a mirror image of a first layer. The nodes, with plated through holes, communicate the first layer 500 with the second layer 514. It is to be understood that in a mirror image situation, a mirror image of the layer must be produced on a second layer, and that the second layer cannot be merely flipped over. In this arrangement, the mirror image effect can be acquired be simply rotating one pathway be 180° with respect to a second pathway to produce the mirror image effect.

Again the electrical circuitry depicted in FIG. 22 can be fabricated and used in much the same manner as the circuitry depicted in FIGS. 16 through 20.

It is further to be understood that during the step where a laser is used to sever the pathways, the laser can be appropriately defocused and used to burn or char the isolation material so that the appropriate identifiers can be placed on the circuitry to locate where components are to be mounted and connections are to be made.

Other aspects, objects and advantages of the invention can be discerned from a study of the figures and the appended claims.

I claim:

1. An electrical circuit of an integrated circuit chip comprising:
   a first alyer having a plurality of first electrical pathways, each of said first electrical pathways having a plurality of first repeating patterns, each of said first repeating patterns including a plurality of mutually aligned first traces;
   wherein the first traces in one of said first electrical pathways are aligned with the first traces in another of said first electrical pathways such that all of said first traces are capable of being cut along a first cut path;
   said first layer further having a plurality of first electrical connecting pathways that interconnect said first repeating patterns of said first electrical pathways so as to form a first grid;
   a second layer located adjacent said first layer, said second layer having a plurality of second electrical pathways, each of said second electrical pathways having a plurality of second repeating patterns, each of said second repeating patterns including a plurality of mutually aligned second traces;
   wherein the second traces in one of said second electrical pathways are aligned with the second traces in another of said second electrical pathways such that all of said second traces are capable of being cut along a second cut path;
   said second layer further having a plurality of second electrical connecting pathways that interconnect said second repeating patterns of said second electrical pathways so as to form a second grid;
   said first cut path being aligned with said second cut path and said first traces being unaligned with said second traces such that any of said first traces and any of said second traces can be cut along said first and second cut paths without cutting any other of said first and second traces;
   communicating means for communicating between the first and second layers; and
   wherein said first traces (44, 46, and 66) are mutually substantially parallel and wherein said second traces (92, 94 and 96) are mutually substantially parallel.

2. The electrical circuit of claim 1 wherein said first and second electrical pathways are metalized.

3. The electrical circuit of claim 1 wherein said first and second cut paths are substantially straight lines (such as cut path (91) FIG. (1) and cut path (93) FIG. (2), which are superimposed as depicted at (113) in FIG. (5)).

4. The electrical circuit of claim 3 wherein said first cut path is substantially perpendicular to said first parallel traces; and
   wherein said second cut path is substantially perpendicular to said second parallel traces.

5. The electrical circuit of claim 1 wherein said first layer overlies said second layer and said first and second cut paths are aligned such that said first cut path overlies said second cut path.

6. The electrical circuit of claim 5 wherein none of said first traces overlie any of said second traces.

7. The electrical circuit of claim 1 and further including insulating means for insulating at least part of said first layer from said second layer.

8. The electrical circuit of claim 1 wherein the patterns on said first layer are substantially identical to the patterns on said second layer.

9. The electrical circuit of claim 1 wherein said first layer overlies said second layer, wherein none of said first traces overlie any of said second traces, and wherein said first cut path overlies said second cut path.

10. The electrical circuit of claim 1 wherein:
    the patterns on the first layer are substantially identical to the patterns on the second layer with the patterns on the second layer located at a position transitionally displaced from the patterns on the first layer.

11. The electrical circuit of claim 1 wherein:
    the patterns on the first layer are substantially identical to the patterns on the second layer with the patterns on the second layer located at a position rotationally displaced from the patterns on the first layer.

12. An electrical circuit of an integrated circuit chip comprising:
    a first layer having a plurality of first electrical pathways, each of said first electrical pathways having a plurality of first repeating patterns, each of said first repeating patterns including a plurality of mutually aligned first traces;
    wherein the first traces in one of said first electrical pathways are aligned with the first traces in another of said first electrical pathways such that all of said first traces are capable of being cut along a first cut path;
    said first layer further having a plurality of first electrical connecting pathways that interconnect said first repeating patterns of said first electrical pathways so as to form a first grid;
    a second layer located adjacent said first layer, said second layer having a plurality of second electrical pathways, each of said second electrical pathways having a plurality of second repeating patterns, each of said second repeating patterns including a plurality of mutually aligned second traces;
    wherein the second traces in one of said second electrical pathways are aligned with the second traces in another of said second electrical pathways such that all of said second traces are capable of being cut along a second cut path;
    said second layer further having a plurality of second electrical connecting pathways that interconnect said second repeating patterns of said second electrical pathways so as to form a second grid;
    said first cut path being aligned with said second cut path and said first traces being unaligned with said second traces such that any of said first traces and any of said second traces can be cut along said first and second cut paths without cutting any other of said first and second traces;

communicating means for communicating between the first and second layers;

wherein said first layer overlies said second layer, wherein none of said first traces overlie any of said second traces, and wherein said first cut path overlies said second cut path; and further including window means provided in one of said first and second layers for allowing access to said traces of said other of said first and second layers along said first and second cut paths to facilitate a selectable severing of the trace.

13. The electrical circuit of claim 12 wherein said window means is transparent to an energy beam.

14. The electrical circuit of claim 12 wherein said window means includes cut out portions.

* * * * *

UNITED STATES PATENT AND TRADEMARK OFFICE
CERTIFICATE OF CORRECTION

PATENT NO. : 4,700,214

DATED : October 13, 1987

INVENTOR(S) : Morgan Johnson

It is certified that error appears in the above-identified patent and that said Letters Patent is hereby corrected as shown below:

Column 1, line 2: "Serial No. 847,727" should be
-- Serial No. 847,726 --

Column 3, line 62: "depicts an another" should be
-- depicts another --

Column 4, line 38: "Kapton" should be -- Kapton® --

Column 11, line 4: "acquired be simply" should be
-- acquired by simply --

Column 11, line 5: "pathway be 180°" should be
-- pathway by 180° --

Column 11, line 23: "a first alyer" should be
-- a first layer --

Signed and Sealed this

Twenty-ninth Day of August, 1989

*Attest:*

DONALD J. QUIGG

*Attesting Officer*  *Commissioner of Patents and Trademarks*